(12) United States Patent
Park et al.

(10) Patent No.: US 11,274,961 B2
(45) Date of Patent: *Mar. 15, 2022

(54) ULTRAVIOLET RAY DETECTING DEVICE HAVING SHOTTKY LAYER FORMING SHOTTKY BARRIER

(71) Applicant: SEOUL VIOSYS CO., LTD, Ansan-si (KR)

(72) Inventors: Ki Yon Park, Ansan-si (KR); Soo Hyun Lee, Ansan-si (KR); Choong Min Lee, Ansan-si (KR); Gun Woo Han, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 795 days.

This patent is subject to a terminal disclaimer.

(21) Appl. No.: 16/070,511

(22) PCT Filed: Jan. 18, 2017

(86) PCT No.: PCT/KR2017/000616
§ 371 (c)(1),
(2) Date: Jul. 16, 2018

(87) PCT Pub. No.: WO2017/126887
PCT Pub. Date: Jul. 27, 2017

(65) Prior Publication Data
US 2021/0199499 A1     Jul. 1, 2021

(30) Foreign Application Priority Data

Jan. 18, 2016 (KR) .................. 10-2016-0005948
Jan. 21, 2016 (KR) .................. 10-2016-0007441
Feb. 15, 2016 (KR) .................. 10-2016-0017185
Jan. 17, 2017 (KR) .................. 10-2017-0008318

(51) Int. Cl.
G01J 1/42     (2006.01)
G01J 1/44     (2006.01)
H01L 31/0224  (2006.01)
H01L 31/103   (2006.01)

(52) U.S. Cl.
CPC ............. G01J 1/429 (2013.01); G01J 1/44 (2013.01); H01L 31/0224 (2013.01); H01L 31/103 (2013.01); G01J 2001/446 (2013.01)

(58) Field of Classification Search
CPC .. H01L 31/108; H01L 31/09; H01L 31/02162; H01L 31/07; H01L 31/109; H01L 31/0224; H01L 31/03; H01L 29/872; H01L 31/103; G01J 1/429; G01J 1/44
USPC .................................. 250/214.1, 214 R, 239
See application file for complete search history.

(56) References Cited

U.S. PATENT DOCUMENTS 5,639,673 A *  6/1997  Vaccaro ............... H01L 31/108
                                                        257/E31.065
9,812,602 B2 * 11/2017  Park ................ H01L 31/022475

* cited by examiner

Primary Examiner — Que Tan Le
(74) Attorney, Agent, or Firm — Perkins Coie LLP

(57) ABSTRACT

An ultraviolet ray detecting device is provided. The ultraviolet ray detecting device comprises: a substrate; a buffer layer disposed on the substrate; a light absorption layer disposed on the buffer layer; a capping layer disposed on the light absorption layer; and a Schottky layer disposed on a partial region of the capping layer, wherein the capping layer has an energy bandgap larger than that of the light absorption layer.

20 Claims, 14 Drawing Sheets

ULTRAVIOLET RAY DETECTING DEVICE HAVING SHOTTKY LAYER FORMING SHOTTKY BARRIER

This patent document claim priority and benefits of International Application No. PCT/KR2017/000616, filed Jan. 18, 2017, which further claims priority to Korean Patent Application No. 10-2016-0005948, filed Jan. 18, 2016; Korean Patent Application No. 10-2016-0007441, filed Jan. 21, 2016; Korean Patent Application No. 10-2016-0017185, filed Feb. 15, 2016; and Korean Patent Application No. 10-2017-0008318, filed Jan. 17, 2017. The entire contents of the aforementioned patent applications are incorporated herein by reference as part of this patent document.

TECHNICAL FIELD

Exemplary embodiments of the present invention relate to a UV light detection device, and more particularly, to a UV light detection device having high detection accuracy with respect to light in the UV wavelength band.

BACKGROUND

Gallium nitride (GaN), silicon carbide (SiC), and the like, have an energy bandgap suitable for UV detection and are generally used for semiconductor diodes.

In particular, GaN semiconductor diodes generally take the form of a Schottky junction, a metal-semiconductor-metal (MSM) junction, and a PIN junction. For a PIN junction GaN-based UV light detection device, it is difficult to secure reproducibility and characteristics of a p-type AlGaN layer having a high Al content, whereas a Schottky junction GaN-based UV light detection device does not require a p-AlGaN layer and thus is preferred due to ease of manufacture.

A typical GaN-based photodetection device includes a buffer layer grown on a heterogeneous substrate and a light absorption layer formed on the buffer layer, and thus has many defects in the buffer layer due to use of the heterogeneous substrate.

When the light absorption layer is grown on the buffer layer having many defects, defects of the light absorption layer are directly affected by the buffer layer so that photo-detection devices can exhibit different photocurrent characteristics on the same wafer. In addition, such photodetection devices have different values in terms of UV photo-reactivity and electric current in response to visible light due to an uneven defect density of the light absorption layer, thereby causing deterioration in productivity, reproducibility, yield and detection accuracy, and errors in measurement target products. Moreover, in fabrication of a UV sensor having a Schottky junction structure, a metal layer is grown on the light absorption layer, thereby causing deterioration in UV photo-reactivity and current leakage depending upon the thickness of the Schottky layer and interfacial characteristics on the light absorption layer.

Moreover, upon Schottky junction to the light absorption layer having many crystal defects, Schottky barrier characteristics can be deteriorated by current leakage, thereby causing deterioration in efficiency of the photodetection device.

SUMMARY

It is one aspect of the present invention to provide a UV light detection device having improved Schottky characteristics.

It is another aspect of the present invention to provide a UV light detection device which includes a capping layer having a higher energy bandgap than a light absorption layer to improve photo-reactivity and leakage current characteristics.

It is another aspect of the present invention to provide a UV light detection device which has improved electrostatic discharge (ESD) characteristics and can relieve stress of a light absorption layer while blocking reaction current due to light other than UV light.

The present invention is not limited to the above aspects and other aspects and advantageous effects of the present invention will become apparent from the following detailed description.

In accordance with one exemplary embodiment of the present invention, a UV light detection device includes: a substrate; a buffer layer disposed on the substrate; a light absorption layer disposed on the buffer layer; a capping layer disposed on the light absorption layer; and a Schottky layer disposed in a partial region of the capping layer, wherein the capping layer has a higher energy bandgap than the light absorption layer.

Exemplary embodiments of the present invention provide a UV light detection device which includes a capping layer having a higher energy bandgap than a light absorption layer to improve photo-reactivity and leakage current characteristics by maximizing Schottky characteristics.

It should be understood that the present invention is not limited to the above effects and includes all advantageous effects derived from the following detailed description and the appended claims.

DETAILED DESCRIPTION

Figure 1:
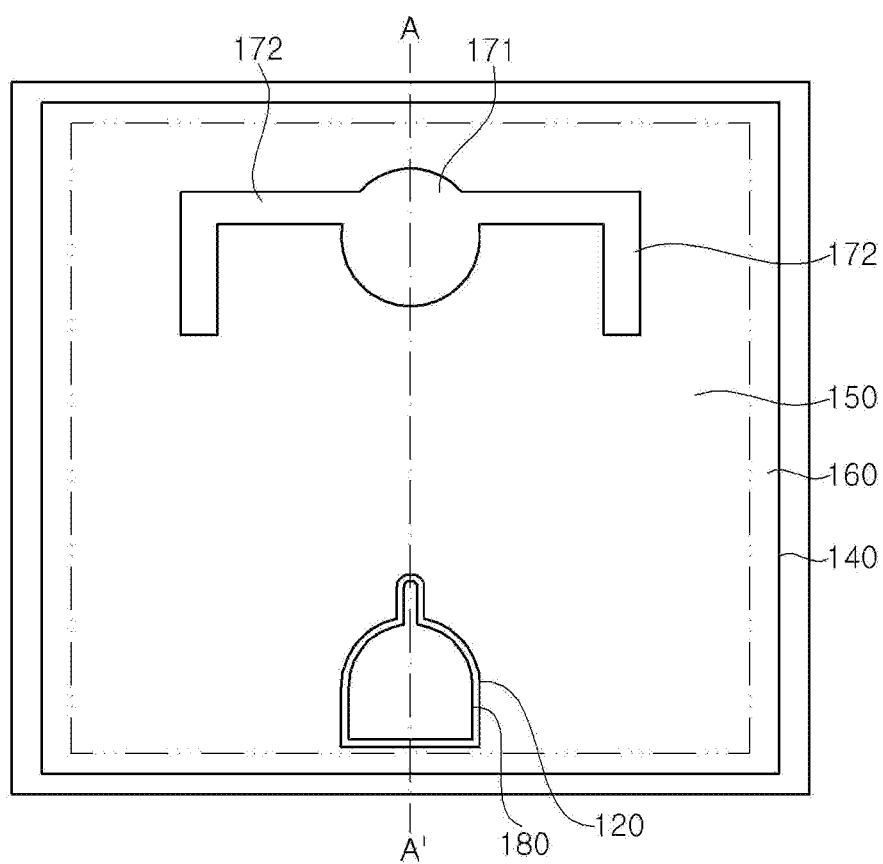
FIG. 1 is a top plan view of a UV light detection device according to one exemplary embodiment of the present invention.

Hereinafter, the present invention will be described in detail with reference to the accompanying drawings. However, it should be understood that the present invention is not limited to exemplary embodiments disclosed herein and can also be implemented in different forms. In the following description, descriptions of details apparent to those skilled in the art are omitted for clarity and like elements are denoted by like reference numerals throughout the specification.

When an element is referred to as being "connected to" another element throughout the specification, it can be directly connected to the other element or can be indirectly connected thereto via intervening elements therebetween. The terms "comprises," "comprising," "includes," and "having," are inclusive and do not preclude the presence or addition of other elements unless stated otherwise.

Hereinafter, exemplary embodiments of the present invention will be described in detail with reference to the accompanying drawings.

Figure 2:
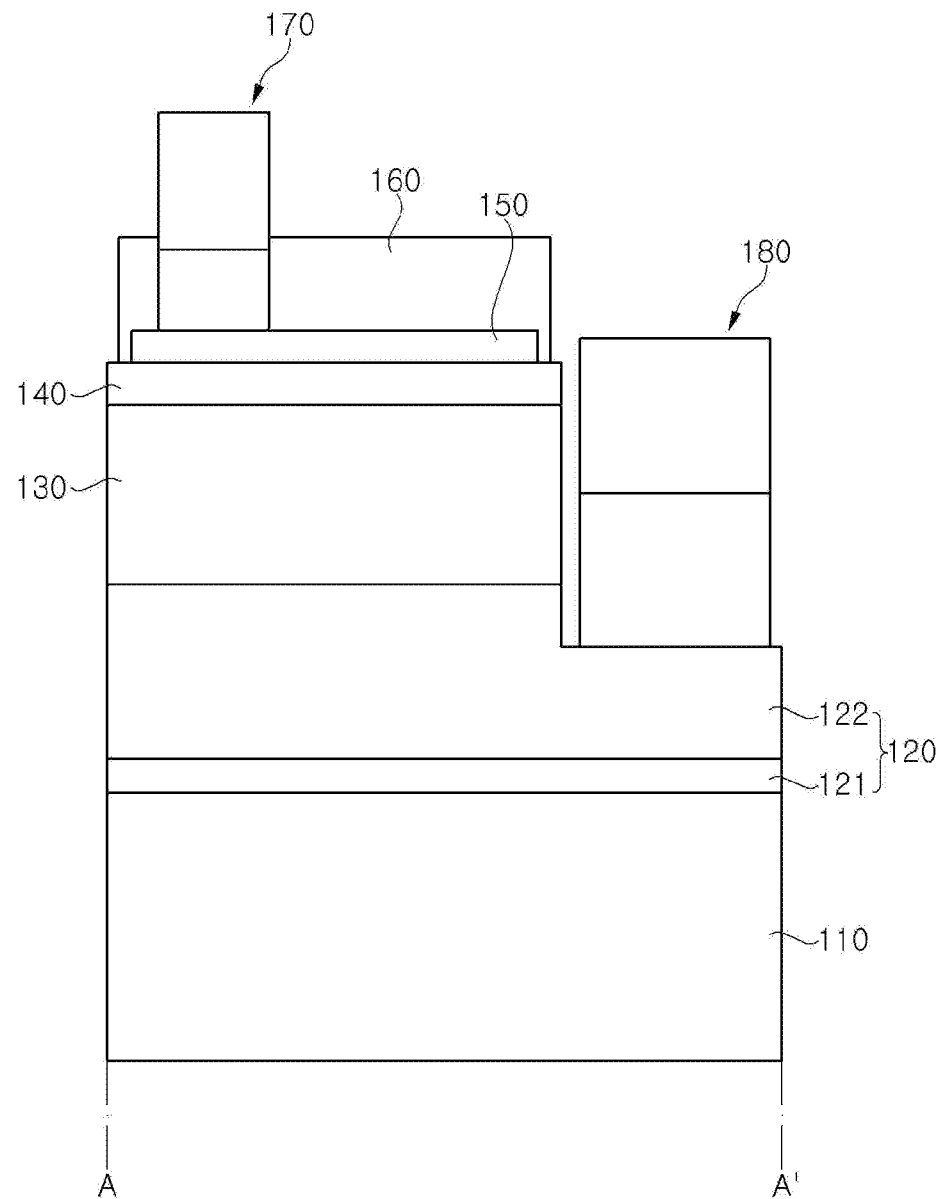
FIG. 2 is a cross-sectional view of the UV light detection device according to the one exemplary embodiment of the present invention.

FIG. 1 is a top plan view of a UV light detection device according to one exemplary embodiment of the present invention and FIG. 2 is a cross-sectional view taken along line A-A' of FIG. 1.

Referring to FIG. 1 and FIG. 2, the UV light detection device according to the exemplary embodiment includes a substrate 110, a buffer layer 120, a light absorption layer 130, a capping layer 140, a Schottky layer 150, and an insulation layer 160. The UV light detection device may further include a first electrode 170 and a second electrode 180.

The substrate 110 serves to grow a semiconductor single crystal, and may include a sapphire substrate, a zinc oxide (ZnO) substrate, a gallium nitride (GaN) substrate, a silicon carbide (SiC) substrate, or an aluminum nitride (AlN) substrate, or others. In particular, the substrate 110 may be a sapphire substrate, which has a high degree of orientation and is free from scratches or marks due to precise polishing.

The buffer layer 120 may include a first buffer layer 121 formed on the substrate 110 and a second buffer layer 122 formed on the first buffer layer 121. The second buffer layer 122 includes a region in which the second electrode 180 contacts the buffer layer 120 as described below, and thus may be referred to as a contact layer.

The first buffer layer 121 may include, for example, a GaN layer. The first buffer layer 121 may be formed by placing the substrate 110 on a susceptor of a reaction chamber of a metal organic chemical vapor deposition (MOCVD) apparatus, removing impurity gas from the reaction chamber through reduction in internal pressure of the reaction chamber to 100 torr or less, thermally cleaning the surface of the substrate 110 by increasing the temperature of the reaction chamber to 1,100° C. while maintaining the internal pressure of the reaction chamber at 100 torr, and decreasing the temperature of the reaction chamber to 500-560° C., preferably 550° C., followed by supplying Ga sources and $NH_3$ gas to the reaction chamber. Here, the overall gas flow of the reaction chamber may be determined by hydrogen gas ($H_2$).

Further, in order to secure crystallinity and optical and electrical characteristics of the second buffer layer 122 grown on the first buffer layer 121, the first buffer layer 121 may be formed to a thickness of at least 25 nm or more.

The first buffer layer 121 serves to improve crystallinity of the second buffer layer 122, thereby improving optical and electrical characteristics of the second buffer layer 122. Further, if the substrate 110 is a heterogeneous substrate such as a sapphire substrate, the first buffer layer 121 can act as a seed layer, on which the second buffer layer 122 can be grown.

The second buffer layer 122 may be grown at a higher temperature than the first buffer layer 121 after growth of the first buffer layer 121. The second buffer layer 122 may be grown by, for example, increasing the temperature of the susceptor to 1,000° C. to 1,100° C., preferably 1,050° C. If the temperature of the susceptor is less than 1,000° C., the optical, electrical and crystallographic characteristics of the second buffer layer can be deteriorated, and if the temperature of the susceptor exceeds 1,100° C., the second buffer layer can have a rough surface and suffer from deterioration in crystallinity.

The second buffer layer 122 may include a material similar to the first buffer layer 121. The second buffer layer 122 may include, for example, a GaN layer. Although a GaN semiconductor exhibits n-type conductivity even without doping, the GaN semiconductor may be doped with Si dopants in order to secure n-type conductivity. When the second buffer layer 122 is doped with dopants including Si, the second buffer layer 122 may have a Si-doping concentration of $1 \times 10^8$ or less. The second buffer layer 122 may have a thickness of about 2.5 μm.

Further, the second buffer layer 122 may be formed by growing a non-doped GaN layer to a thickness of 1.5 μm on the first buffer layer 121.

The light absorption layer 130 may be grown on the second buffer layer 122. The light absorption layer 130 may include a nitride semiconductor and may be grown on the second buffer layer 122 by selectively applying elements and a composition of the nitride semiconductor depending upon wavelengths of light to be detected by the light detection device.

According to this exemplary embodiment, the light absorption layer 130 generates electric current through absorption of light in the UV wavelength band, and may include, for example, an $Al_xGa_{1-x}N$ (0<x<0.7) layer, a GaN layer or an InGaN layer. Here, it is possible to select a suitable light absorption layer according to the wavelengths of light to be detected by the light detection device based on the fact that the $Al_xGa_{1-x}N$ (0<x<0.7) layer has the highest energy band gap and the InGaN layer has the lowest band gap.

Specifically, the light absorption layer 130 including an $Al_xGa_{1-x}N$ (0<x<0.7) layer may be grown after growth of the second buffer layer 122. In this case, the energy bandgap of the light absorption layer 130 differs depending upon the wavelength band of light to be absorbed by the light absorption layer and the light absorption layer 130 can be grown to have a suitable energy bandgap through suitable adjustment of the Al content thereof.

Alternatively, the light absorption layer 130 including a GaN layer may be grown after growth of the second buffer layer 122. Here, the light absorption layer 130 including a GaN layer may be grown at a temperature of about 1,000° C. to 1,100° C. Alternatively, the light absorption layer 130 including an $In_yGa_{1-y}N$ layer (0<y<1) layer may be grown after growth of the second buffer layer 122. Here, the light absorption layer 130 including an $In_yGa_{1-y}N$ layer (0<y<1) layer may be grown at a temperature of about 800° C.

The light absorption layer 130 may be grown to a thickness of 0.05 μm to 0.5 μm, preferably about 0.15 μm in consideration of effects of cracks and the like. In addition, although the light absorption layer 130 can be composed of multiple layers, the light absorption layer 130 is more advantageously composed of a single layer in order to maximize Schottky characteristics.

The capping layer 140 is grown on the light absorption layer 130. The capping layer 140 serves to supplement the Schottky layer 150 and facilitates achievement of the Schottky characteristics of the Schottky layer 150.

According to this exemplary embodiment, the capping layer 140 has a higher energy bandgap than the light absorption layer 130. With reference to an incident direction of light, the capping layer 140 may be disposed on the light absorption layer 130. Accordingly, if the capping layer 140 has a narrower energy bandgap than the light absorption layer 130, part of incident light can be absorbed by the capping layer 140, thereby reducing photo-reactivity of the UV light detection device. Thus, according to this exemplary embodiment, the capping layer 140 may include a layer having a higher energy bandgap than the light absorption layer 130.

For example, in the structure wherein the light absorption layer 130 includes an $Al_xGa_{1-x}N$ (0<x<0.7) layer, as described above, the capping layer 140 may be formed by, for example, growing an $Al_{k1}Ga_{1-k1}N$ layer (0<k1<1) having a higher Al content than the light absorption layer on the light absorption layer 130. In another example, in the structure wherein the light absorption layer 130 includes a GaN layer, the capping layer 140 may be formed by supplying an Al source at the same growth temperature as the light absorption layer 130, for example, at a temperature of 1,000° C. to 1,100° C., to grow an $Al_{k2}Ga_{1-k2}N$ layer (0<k2<1) on the light absorption layer 130. In another example, in the structure wherein the light absorption layer 130 includes an InGaN layer, the capping layer 140 may be formed by growing a GaN layer and/or an $Al_{k3}Ga_{1-k3}N$ layer (0<k3<1).

The capping layer 140 may have a thickness allowing the tunneling effect, for example, a thickness of 1 nm to 10 nm. If the capping layer 140 is too thick, the capping layer can act as the light absorption layer. The capping layer 140 may be grown at the same or higher temperature than the light absorption layer 130.

The Schottky layer 150 is formed in a partial region of the capping layer 140. The Schottky layer 150 may include a metal layer, for example, at least one of ITO, Ni, ATO, Pt, W, Ti, Pd, Ru, Cr, or Au. In particular, the Schottky layer 150 may be formed of Ni having good transmittance with respect to UV light. In this case, since the UV light transmittance of the Schottky layer 150 can be decreased with increasing thickness thereof, the Schottky layer 150 may be formed to a thickness of 3 nm to 10 nm in consideration of UV light transmittance and Schottky barrier characteristics.

The Schottky layer 150 composed of a metal layer can form a Schottky junction with respect to the light absorption layer 130, which includes an $Al_xGa_{1-x}N$ (0<x<0.7) layer, a GaN layer or an $In_yGa_{1-y}N$ (0<y<1) layer. In an operation mode of the UV light detection device, reverse bias can be applied to the Schottky layer 150 and the light absorption layer 130. Since the magnitude of electric current varying depending on the intensity of incident light is higher in a reverse bias region than in a 0V (volt) region, the UV light detection device can be more suitably operated in the reverse bias region.

As described above, the capping layer 140 may be interposed between the light absorption layer 130 and the Schottky layer 150 and the energy bandgap of the capping layer 140 may be higher than that of the light absorption layer 130. The capping layer 140 having a high energy bandgap can improve Schottky characteristics resulting from the Schottky junction between the light absorption layer 130 and the Schottky layer 150.

Figure 3A:
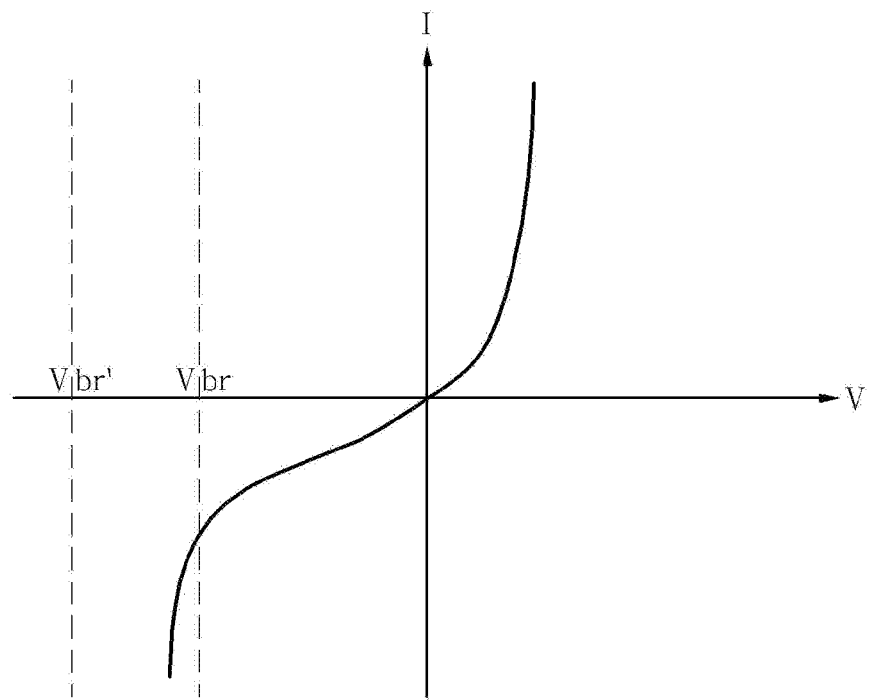
FIGS. 3A and 3B show graphs depicting improvement of Schottky characteristics of the UV light detection device according to the one exemplary embodiment of the present invention.
Figure 3B:
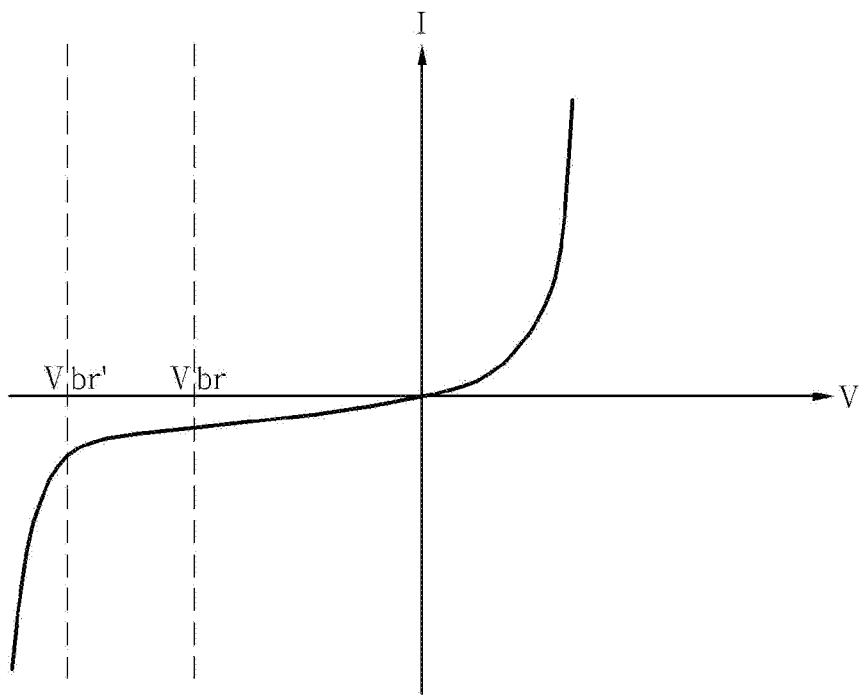

FIGS. 3A and 3B show graphs depicting improvement in Schottky characteristics of the UV light detection device according to the one exemplary embodiment of the present invention.

FIG. 3A is an I-V (current-voltage) curve of a typical Schottky junction. The light absorption layer 130 can have poor crystallinity due to various factors, for example, low growth temperature and the like, and when the light absorption layer 130 has poor crystallinity, there can be a problem that a normal Schottky barrier is not formed. Referring to FIG. 3A, the I-V curve of the Schottky junction shows that the maximum voltage that a diode can withstand without breaking upon application of reverse bias thereto, that is, the peak reverse voltage Vbr (or breakdown voltage), is low and leakage current is rapidly increased even by a low reverse bias voltage due to the leakage current characteristics of the I-V curve. As a result, the UV light detection device can malfunction due to the leakage current.

FIG. 3B is an I-V (current-voltage) curve of the Schottky junction to which the capping layer 140 according to the present invention is applied. According to the exemplary embodiment of the present invention, the I-V curve shown in FIG. 3A can be changed into the I-V curve of FIG. 3B due to the capping layer 140 having a high energy bandgap. That is, the I-V curve of FIG. 3B shows that a high Schottky barrier can be formed due to the capping layer 140 and the leakage current characteristics are improved. The I-V curve of FIG. 3B has better linearity in the reverse bias region than the I-V curve of FIG. 3A, and shows that the peak reverse voltage Vbr' is increased and rapid increase in dark current can be minimized even upon application of a relatively high reverse bias voltage. Accordingly, the UV light detection device can withstand a higher reverse bias.

As the reverse bias is increased, a depletion layer formed in the light absorption layer 130 under the Schottky layer 150 can be further broadened, thereby improving efficiency in photo-reactivity of the UV light detection device. That is, as the depletion layer is broadened with increasing reverse bias, the response rate (or reaction rate) can be increased through reduction in capacitance of the UV light detection device.

The insulation layer 160 may be formed to seal the Schottky layer 150 on the capping layer 140. For example, the insulation layer 160 may be formed to cover the Schottky layer 150 while covering a portion of the capping layer 140 exposed along the periphery of the Schottky layer 150. That is, the insulation layer 160 contacts both the Schottky layer 150 and a portion of the capping layer 140 to secure the Schottky layer 150 on the capping layer 140, thereby improving reliability and yield of the UV light detection device by preventing the Schottky layer 150 from peeling due to stress generated upon wire bonding. Further, the insulation layer 160 can be used as a protective layer with respect to external static electricity. The insulation layer 160 may include one of a $SiN_x$ layer and a $SiO_x$ layer.

The insulation layer 160 allows the Schottky layer 150 to have a uniform thickness. The Schottky layer 150 is composed of a metal layer and may be subjected to annealing upon formation thereof. Annealing may be performed at a temperature of, for example, about 200° C. to 300° C. and can improve junction between the Schottky layer 150 and a nitride semiconductor layer, that is, the capping layer 140. During such an annealing process, the Schottky layer 150 can be oxidized. For example, when the Schottky layer 150 is formed of a metal such as Ni, Ni can be oxidized into $NiO_x$ during annealing, thereby increasing the volume of the Schottky layer 150. Here, it should be understood that the Schottky layer 150 is not limited thereto and may include other metals, and such metals can be oxidized during annealing.

Here, if the insulation layer 160 covering the Schottky layer 150 is not formed as in the related art, Ni of the Schottky layer 150 can become $NiO_x$ through oxidation with external oxygen (for example, oxygen in air) during annealing. Such an annealing process through supply of oxygen from the outside can cause a non-uniform thickness of the Schottky layer 150. That is, the thickness of the Schottky layer 150 formed of Ni can become uneven depending upon the degree of oxidation on the Schottky layer 150. The non-uniform thickness of the Schottky layer 150 can cause non-uniformity of light transmittance and reactivity, thereby deteriorating reliability of the UV light detection device.

On the contrary, according to this exemplary embodiment, the insulation layer 160 is formed to cover the Schottky layer 150 and annealing after formation of the insulation layer 160 allows the Schottky layer 150 to have a uniform thickness. That is, the insulation layer 160 can prevent the Schottky layer 150 from contacting external oxygen. In addition, the insulation layer 160 can contain oxygen therein and thus can restrictively and uniformly supply oxygen to the Schottky layer 150. Accordingly, during annealing, the insulation layer 160 can prevent the Schottky layer 150 from having a non-uniform thickness through non-uniform oxidation. For example, the insulation layer 160 covering the Schottky layer 150 may be formed of $SiO_x$. During annealing, oxygen contained in the insulation layer 160 is restrictively and uniformly supplied to the Schottky layer 150, thereby allowing uniform oxidation in the Schottky layer 150. As a result, despite slight increase in volume of the Schottky layer 150, the thickness of the Schottky layer 150 can become uniform, whereby the UV light detection device can have uniform light transmittance and reactivity, thereby securing reliability.

The UV light detection device according to this exemplary embodiment may further include the first electrode 170 disposed on the Schottky layer 150 and the second electrode 180 disposed in an exposed region on the buffer layer 120.

The first electrode 170 may be formed in a partial region on the Schottky layer 150. The first electrode 170 may include a metal and may be composed of multiple layers. For example, the first electrode 170 may have a stacked structure of Ni/Au layers.

Since the region of the Schottky layer 150 having the first electrode 170 formed thereon does not allow transmission of light therethrough and prevents the Schottky layer 150 from functioning, it is desirable that the first electrode 170 be formed in an area for wire bonding as small as possible. According to the exemplary embodiment, the first electrode 170 is formed near a side of the Schottky layer 150 so as to face the second electrode 180 in the lateral direction. Referring to FIG. 1, the first electrode 170 includes a body 171 and a pair of branches 172 extending from the body 171 in opposite directions to allow uniform current flow in the Schottky layer 150. Since reaction current in response to UV light significantly varies depending upon the area of the Schottky layer 150 even for a detection device of the same size, it is desirable that the area of the Schottky layer 150 be maximized.

In addition, the UV light detection device according to this exemplary embodiment includes the insulation layer 160 covering the Schottky layer 150. Accordingly, in order to define a region in which the first electrode 170 is connected to the Schottky layer 150, the insulation layer 160 may be partially removed by etching.

The second electrode 180 may form ohmic contact with the buffer layer 120 and may be composed of multiple layers. For example, the second electrode 180 may have a stacked structure of Ni/Au layers.

The second electrode 180 may be formed in an exposed region of the second buffer layer 122, which is exposed by dry etching the capping layer 140 and the light absorption layer 130. Here, the second electrode 180 and the second buffer layer 122 are formed to exhibit ohmic characteristics and a portion of the second buffer layer 122 may also be removed upon etching.

The second electrode 180 is formed in a partial region on the second buffer layer 122 to be separated from the first electrode 170 and may extend towards the center of the second buffer layer 122 in order to secure uniform current flow. However, it should be understood that the shape of the second electrode is not limited thereto.

Figure 4:
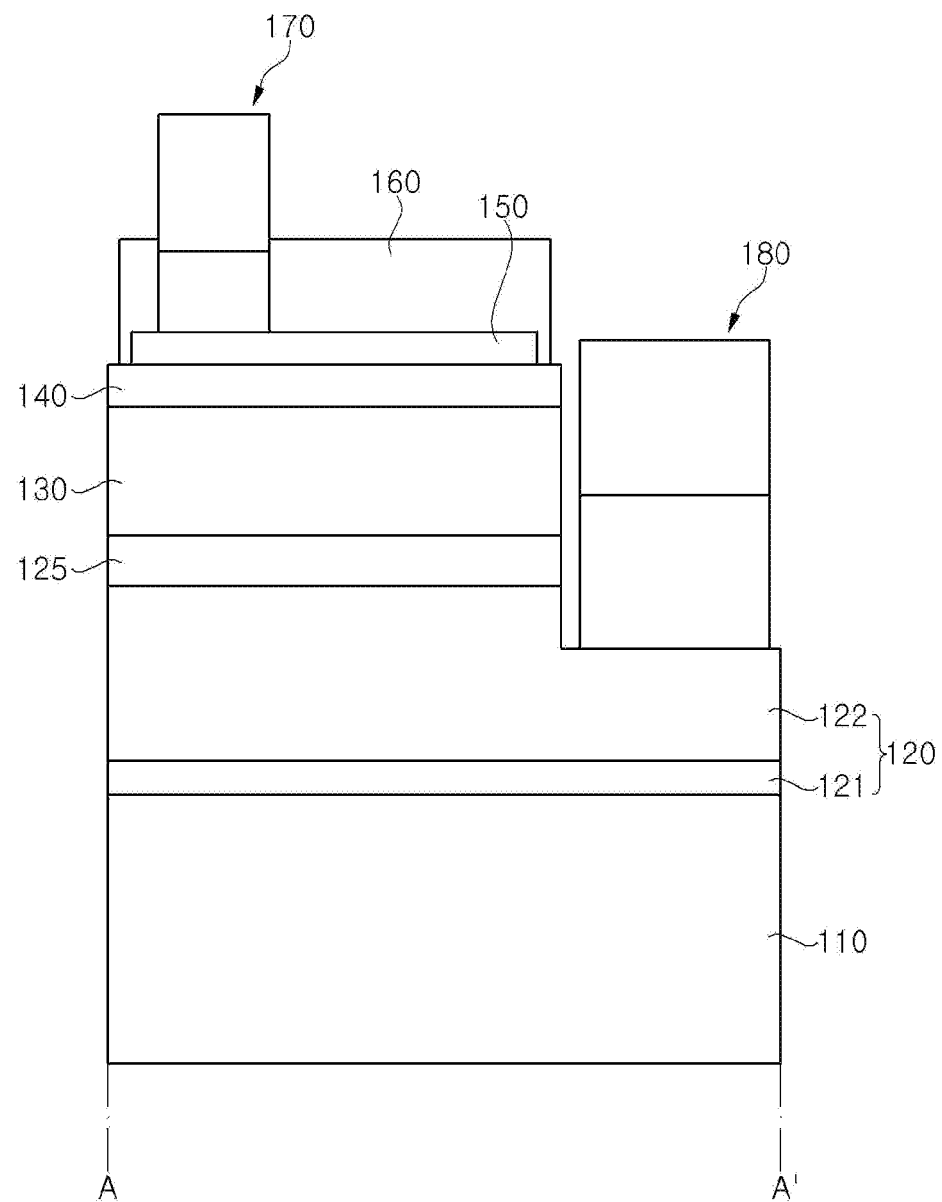
FIG. 4 is a cross-sectional view of a UV light detection device according to another exemplary embodiment of the present invention.

FIG. 4 is a cross-sectional view of a UV light detection device according to another exemplary embodiment of the present invention. The cross-sectional view of FIG. 4 is taken along line A-A' of FIG. 1 and the UV light detection device according to this exemplary embodiment further includes a low current blocking layer 125, as compared with the UV light detection device shown in FIG. 2. Thus, detailed description of the same components will be omitted and the following description will focus on different features of the UV light detection device according to this exemplary embodiment.

Referring to FIG. 4, the low current blocking layer 125 is grown on the buffer layer 120 at a lower temperature than the light absorption layer 130. In this exemplary embodiment, the light absorption layer 130 may include an $Al_xGa_{1-x}N$ (0<x<0.7) layer or a GaN layer, and the low current blocking layer 125 may include a single $Al_tGa_{1-t}N$ (0<t<1) layer. Further, the low current blocking layer 125 may include a plurality of $Al_{t1}Ga_{1-t1}N$ (0<t1<1)/$Al_{t2}Ga_{1-t2}N$ (0<t2<1) layers having different Al contents. In the structure wherein the low current blocking layer 125 includes a plurality of layers, these layers may have the same thickness or different thicknesses, and the thickness of each layer and the number of layers constituting the low current blocking layer can be suitably selected, as needed.

The stacked structure of nitride layers having different Al contents may be formed by growing the nitride layers at different pressures. For example, in the structure wherein the low current blocking layer 125 has a multilayer structure wherein $Al_{t1}Ga_{1-t1}N$ (0<t1<1) layers and $Al_{t2}Ga_{1-t2}N$ (0<t2<1) layers are alternately stacked one above another, the $Al_{t1}Ga_{1-t1}N$ (0<t1<1) layers are grown at a pressure of about 100 Torr and the $Al_{t2}Ga_{1-t2}N$ (0<t2<1) layers are grown at a pressure of about 400 Torr.

Here, under the same growth conditions excluding pressure, the $Al_{t1}Ga_{1-t1}N$ (0<t1<1) layers grown at a lower pressure can have a higher Al content than the $Al_{t2}Ga_{1-t2}N$ (0<t2<1) layers grown at a higher pressure.

As such, the nitride layers grown at different pressures may have different growth rates due to a difference in growth pressure. As the nitride layers have different growth rates, it is possible to control the Al content and the growth thickness thereof under the same growth conditions excluding pressure.

Preferably, the total thickness of the low current blocking layer 125 is determined to block and control the flow of low current generated by visible light absorbed by the light absorption layer 130. For example, the low current blocking layer may have a thickness of 100 nm or less.

The low current blocking layer 125 may have a higher defect density than the light absorption layer 130. Such a higher defect density of the low current blocking layer 125 can be obtained by growing the low current blocking layer 125 at a lower temperature than the light absorption layer 130. For example, the light absorption layer 130 may be grown at about 1,050° C. and the low current blocking layer 125 may be grown at a temperature 30° C. to 200° C. lower than the growth temperature of the light absorption layer. If the growth temperature of the low current blocking layer 125 is further lower than this range, crystallinity of the light absorption layer 130 formed on the low current blocking layer 125 can be rapidly deteriorated, thereby causing deterioration in quantum efficiency of the light absorption layer 130. Thus, it is desirable that the low current blocking layer 125 be grown at a temperature 200° C. lower than the growth temperature of the light absorption layer 130. When the low current blocking layer 125 is grown at a lower temperature than the light absorption layer 130, the light absorption layer 130 has a higher density of defects, such as dislocations and vacancies, than the light absorption layer, such that migration of electrons generated by visible light can be prevented, thereby blocking flow of minute current and providing uniform reaction current with respect to visible light over the entirety of a wafer.

In the UV light detection device according to exemplary embodiments, electrons generated in the light absorption layer 130 by visible light are captured by the low current blocking layer 125, thereby preventing the detection device from being driven by visible light as much as possible. As described above, the low current blocking layer 125 is grown at a lower temperature and thus has a higher defect density than the light absorption layer 130. Since the number of electrons generated by visible light is much smaller than the number of electrons generated by UV light, defects in the low current blocking layer 125 can sufficiently prevent migration of the electrons. That is, the low current blocking layer 125 has a higher defect density than the light absorption layer 130, thereby preventing migration of the electrons generated by visible light.

With the low current blocking layer 125, the UV light detection device according to this exemplary embodiment can reduce the intensity of excitation of the buffer layer 120 in terms of PL (optical characteristics) and sensitivity to visible light in terms of reactivity, as compared with the UV light detection device according to the above exemplary embodiment.

On the other hand, since the number of electrons generated by irradiation of the light absorption layer 130 with UV light is much more than the number of electrons generated by irradiation with visible light, electrons generated by irradiation with UV light are not captured by the low current blocking layer 125 to allow current flow in the detection device. Therefore, the UV light detection device according to the exemplary embodiments has very low reactivity with respect to visible light and thus can have a higher UV light reaction ratio to visible light as compared with a typical UV light detection device.

Particularly, the reaction ratio of visible light to UV light of the UV light detection device according to the exemplary embodiments is 104 or more. Accordingly, the present invention can provide a UV light detection device having high detection efficiency and reliability.

Figure 5A:
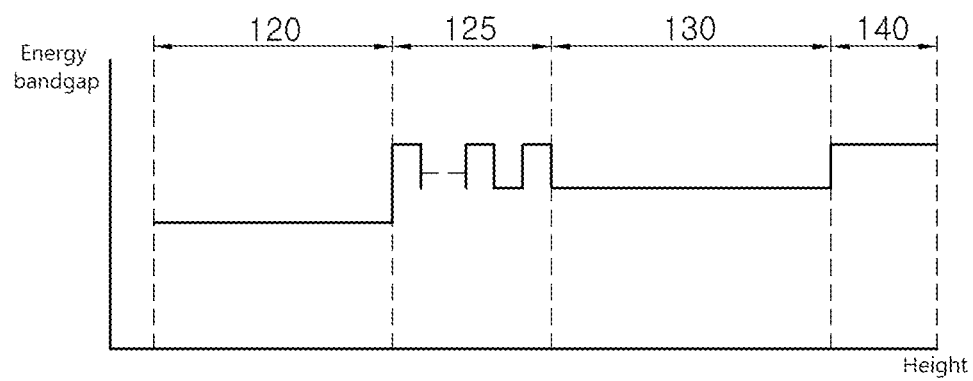
FIGS. 5A and 5B show energy band diagrams of a UV light detection device according to one exemplary embodiment of the present invention.
Figure 5B:
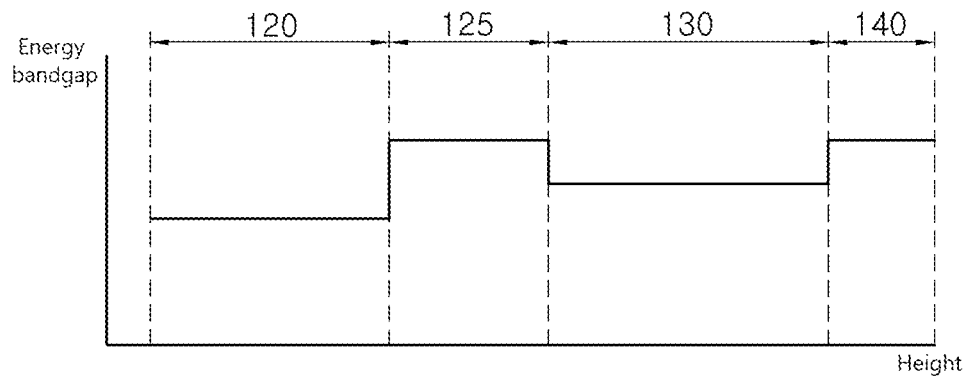

FIGS. 5A and 5B show energy band diagrams of a UV light detection device according to one exemplary embodiment of the present invention. Specifically, FIG. 5A and FIG. 5B are the energy band diagrams of nitride layers of the UV light detection device shown in FIG. 4, in which the light absorption layer 130 includes an $Al_xGa_{1-x}N$ (0<x<0.7) layer.

Referring to FIG. 5A and FIG. 5B, the light absorption layer 130 including an $Al_xGa_{1-x}N$ (0<x<0.7) (0<x<0.7) layer has a higher energy bandgap than the buffer layer 120 including a GaN layer, and the capping layer 140 including an $Al_{k1}Ga_{1-k1}N$ (0<k1<1) layer having a higher Al content than the light absorption layer 130 has a higher energy bandgap than the light absorption layer 130.

Referring to FIG. 5A, the low current blocking layer 125 has a stacked structure of $Al_tGa_{1-t}N$ (0<t<1) layers having different Al contents. If the Al content of the low current blocking layer 125 is higher than the Al content of the light absorption layer 130 or if the Al content of the low current blocking layer 125 is lower than the Al content of the light absorption layer 130, the cut-off inclination can be changed. Referring to FIG. 5B, the low current blocking layer 125 may be composed of a single $Al_tGa_{1-t}N$ (0<t<1) layer. With this structure, the low current blocking layer 125 may have a higher energy bandgap than the light absorption layer 130.

Figure 6A:
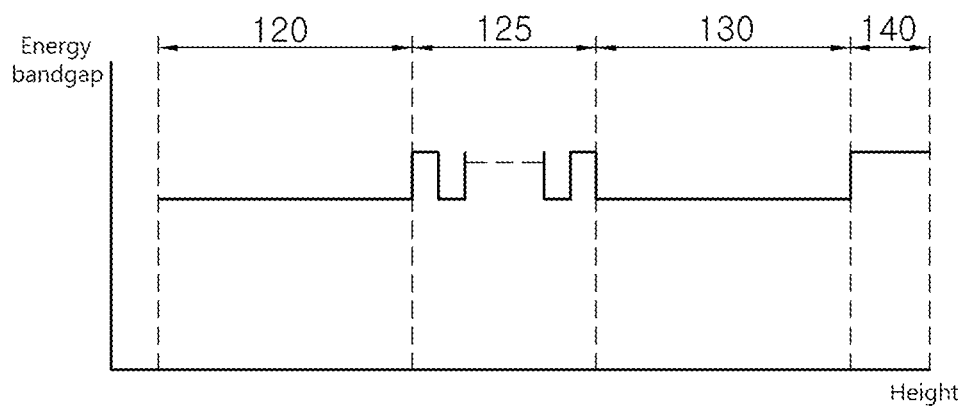
FIGS. 6A and 6B show energy band diagrams of a UV light detection device according to another exemplary embodiment of the present invention.
Figure 6B:
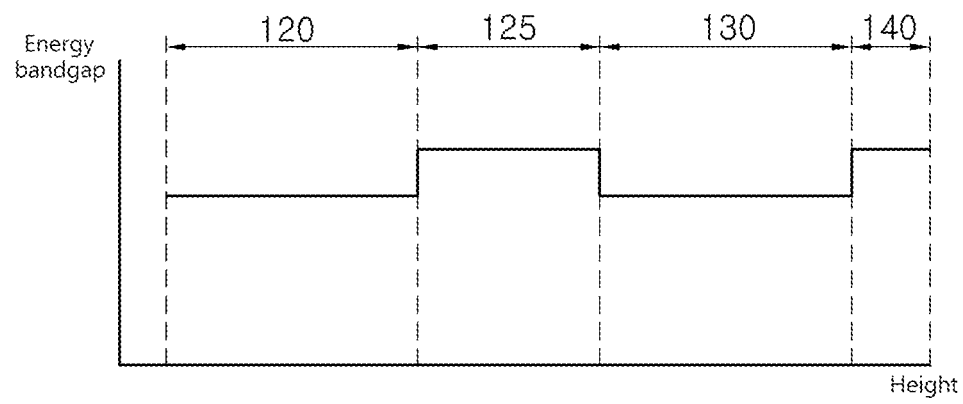

FIGS. 6A and 6B show energy band diagrams of a UV light detection device according to another exemplary embodiment of the present invention. Specifically, FIG. 6A and FIG. 6B are the energy band diagrams of nitride layers of the UV light detection device shown in FIG. 4, in which the light absorption layer 130 includes a GaN layer.

Referring to FIG. 6A and FIG. 6B, the buffer layer 120 including a GaN layer may have the same energy bandgap as the light absorption layer 130 including a GaN layer and the capping layer 140 including an $Al_{k2}Ga_{1-k2}N$ (0<k2<1) layer has a higher energy bandgap than the light absorption layer 130.

Referring to FIG. 6A, the low current blocking layer 125 has a stacked structure of $Al_tGa_{1-t}N$ (0<t<1) layers having different Al contents. If the Al content of the low current blocking layer 125 is higher than the Al content of the light absorption layer 130 or if the Al content of the low current blocking layer 125 is lower than the Al content of the light absorption layer 130, the cut-off inclination can be changed. Referring to FIG. 6B, the low current blocking layer 125 may be composed of a single $Al_tGa_{1-t}N$ (0<t<1) layer. With this structure, the low current blocking layer 125 may have a higher energy bandgap than the light absorption layer 130.

Figure 7:
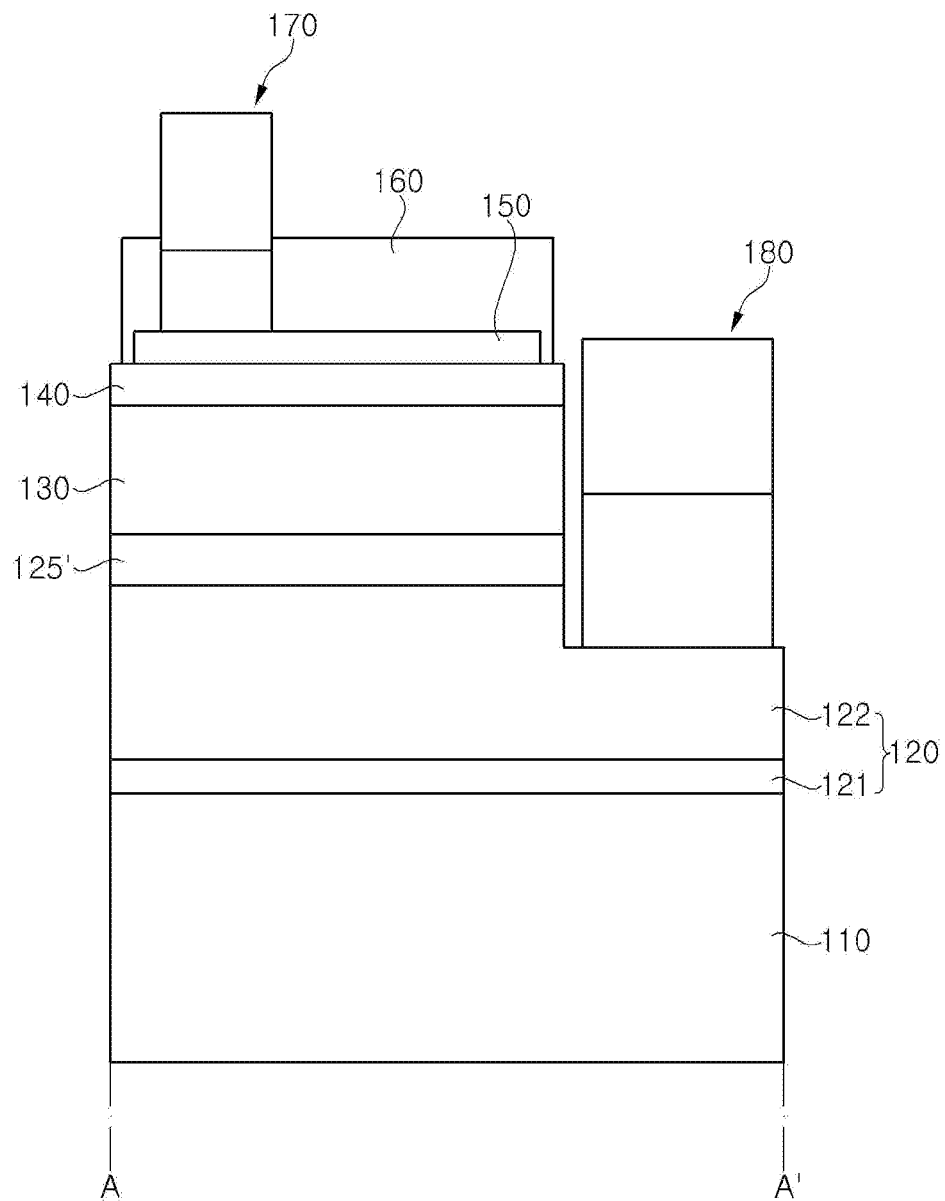
FIG. 7 is a cross-sectional view of a UV light detection device according to a further exemplary embodiment of the present invention.

FIG. 7 is a cross-sectional view of a UV light detection device according to a further exemplary embodiment of the present invention. The cross-sectional view of FIG. 7 is taken along line A-A' of FIG. 1 and the UV light detection device according to this exemplary embodiment further includes an intermediate buffer layer 125', as compared with the UV light detection device shown in FIG. 2. Thus, detailed description of the same components will be omitted and the following description will focus on different features of the UV light detection device according to this exemplary embodiment.

The intermediate buffer layer 125' is interposed between the light absorption layer 130 and the second buffer layer 122 and is grown at the same or higher temperature than the light absorption layer 130.

In the structure wherein the light absorption layer 130 includes an $In_yGa_{1-y}N$ (0<y<1) layer, the intermediate buffer layer 125' may include a stacked structure of $In_zGa_{1-z}N$ (0<z<1)/GaN layers alternately stacked one above another. In the structure wherein the intermediate buffer layer 125' includes a plurality of layers, these layers may have the same thickness or different thicknesses, and the thickness of each layer and the number of layers constituting the intermediate buffer layer 125' can be suitably selected, as needed. If the total thickness of the intermediate buffer layer 125' is a critical thickness or more, there can be a problem of deterioration in crystallinity of the intermediate buffer layer and efficiency of the light absorption layer. Thus, the thickness of the intermediate buffer layer can be limited. The total thickness of the intermediate buffer layer 125' may be set to 50 nm or more in order to improve crystallinity of the light absorption layer 130.

For example, in fabrication of a light reception device for detecting UV light in the UVA range, the second buffer layer 122 is grown at 1,050° C., followed by growing the intermediate buffer layer 125' at about 900° C. and the light absorption layer 130 at about 800° C. According to this exemplary embodiment, the intermediate buffer layer 125' serves to improve photocurrent efficiency of the light absorption layer 130 by supplementing crystalline characteristics during growth of the light absorption layer 130 at a lower temperature than the second buffer layer 122, and to adjust the cut-off inclination in some cases.

Figure 8:
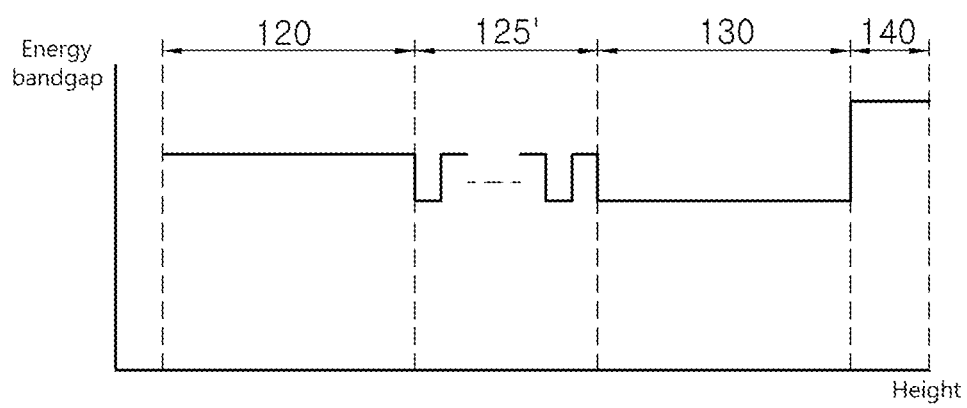
FIG. 8 shows an energy band diagram of a UV light detection device according to a further exemplary embodiment of the present invention.

FIG. 8 shows energy band diagrams of a UV light detection device according to a further exemplary embodiment of the present invention. Specifically, FIG. 8A and FIG. 8B are the energy band diagrams of nitride layers of the UV light detection device shown in FIG. 7, in which the light absorption layer 130 includes an $In_yGa_{1-y}N$ (0<y<1) layer and the capping layer 140 includes a GaN layer and/or an $Al_{k3}Ga_{1-k3}N$ (0<k3<1) layer.

Referring to FIG. 8, the contact layer 120 including a GaN layer has the same or higher energy bandgap than the intermediate buffer layer 125' including GaN/$In_zGa_{1-z}N$ (0<z<1) layers alternately stacked one above another, and the light absorption layer 130 including an $In_yGa_{1-y}N$ (0<y<1) layer has the same or smaller energy bandgap than the intermediate buffer layer 125'. In addition, the capping layer 140 including a GaN layer and/or an $Al_{k3}Ga_{1-k3}N$ (0<k3<1) layer has a higher energy bandgap than the light absorption layer 130.

Figure 9:
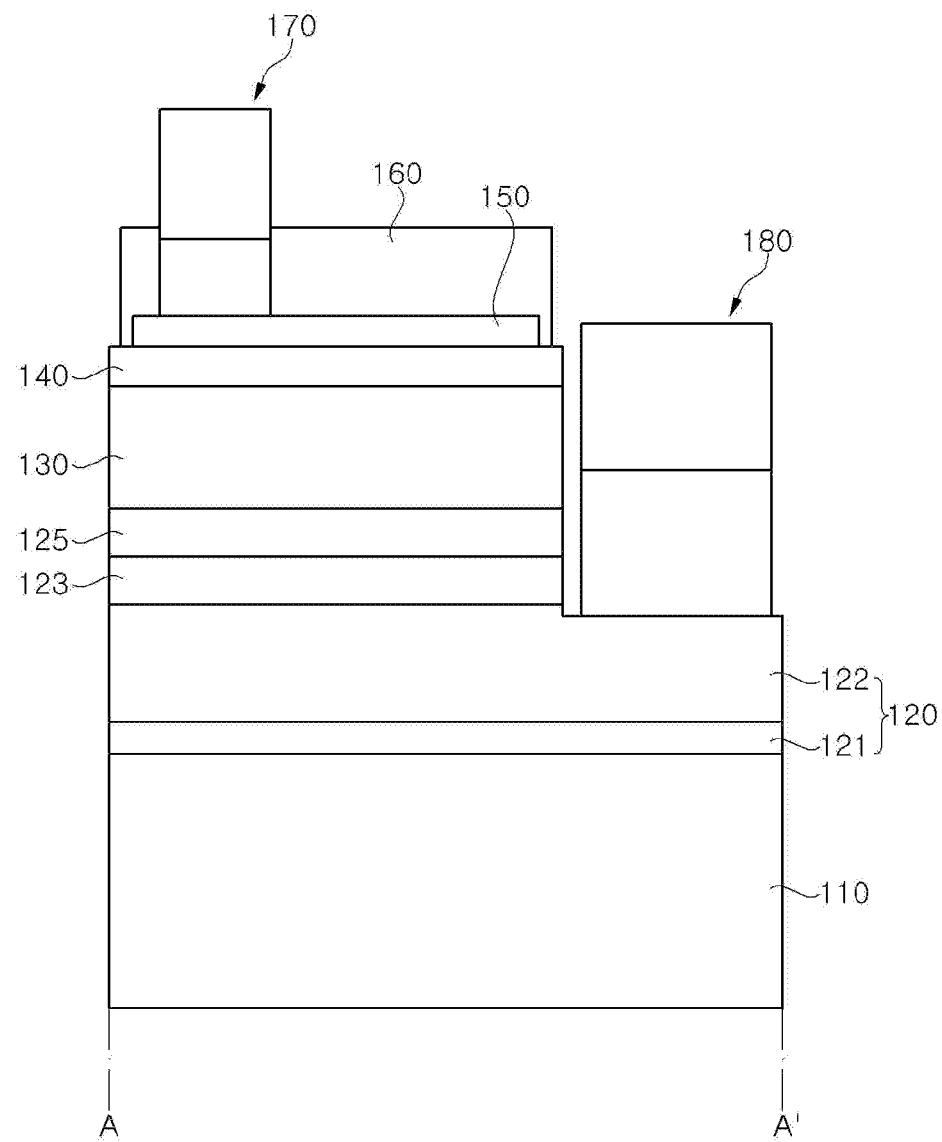
FIG. 9 is a cross-sectional view of a UV light detection device according to yet another exemplary embodiment of the present invention.

FIG. 9 is a cross-sectional view of a UV light detection device according to yet another exemplary embodiment of the present invention. The cross-sectional view of FIG. 9 is taken along line A-A' of FIG. 1 and the UV light detection device according to this exemplary embodiment further includes an anti-ESD layer 123, as compared with the UV light detection device shown in FIG. 4. Thus, detailed description of the same components will be omitted and the following description will focus on different features of the UV light detection device according to this exemplary embodiment.

The anti-ESD layer 123 may include a GaN layer. The anti-ESD layer 123 may be formed by growing a GaN layer not doped with Si ("Si non-doped GaN layer") to a thickness of 1 μm on the second buffer layer 122 in order to form ohmic contact upon formation of the first electrode 170, for example, an n-type electrode, on the second buffer layer 122. Specifically, since a Schottky junction structure has lower anti-ESD characteristics than a PIN structure, the anti-ESD layer 123 including a Si non-doped GaN layer is grown before formation of the low current blocking layer 125 in order to improve the anti-ESD characteristics in the UV light detection device having the Schottky junction structure. The anti-ESD layer 123 improves the anti-ESD characteristics of the UV light detection device.

In order to form the second electrode 180, not only the capping layer 140, the light absorption layer 130, and the low current blocking layer 125 but also the anti-ESD layer 123 may be removed by dry etching. In this case, the second electrode 180 may be formed on the second buffer layer 122 exposed by etching.

Figure 10A:
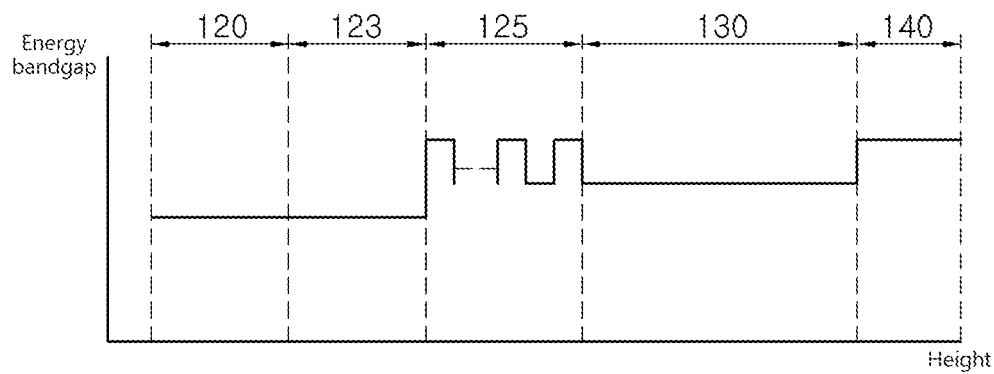
FIGS. 10A and 10B show an energy band diagrams of a UV light detection device according to yet another exemplary embodiment of the present invention.
Figure 10B:
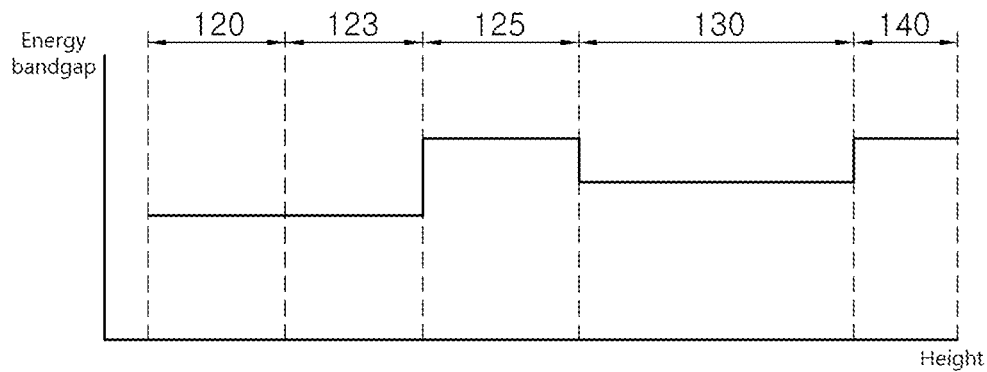

FIGS. 10A and 10B show energy band diagrams of a UV light detection device according to yet another exemplary embodiment of the present invention. Specifically, FIG. 10A and FIG. 10B are the energy band diagrams of nitride layers of the UV light detection device shown in FIG. 9, in which the light absorption layer 130 includes an $Al_xGa_{1-x}N$ (0<x<0.7) layer and the capping layer 140 includes an $Al_{k1}Ga_{1-k1}N$ (0<k1<1) layer having a higher Al content than the light absorption layer 130.

Referring to FIG. 10A and FIG. 10B, the contact layer 120 has the same energy bandgap as the anti-ESD layer 123. In addition, the light absorption layer 130 has a higher energy bandgap than the contact layer 120 and the capping layer 140 has a higher energy bandgap than the light absorption layer 130.

Referring to FIG. 10A, the low current blocking layer 125 is composed of $Al_tGa_{1-t}N$ (0<t<1) layers having different Al contents, and if the Al content of the low current blocking layer 125 is higher than that of the light absorption layer 130 or the Al content of the low current blocking layer 125 is lower than that of the light absorption layer 130, the cut-off inclination can be changed.

Figure 11:
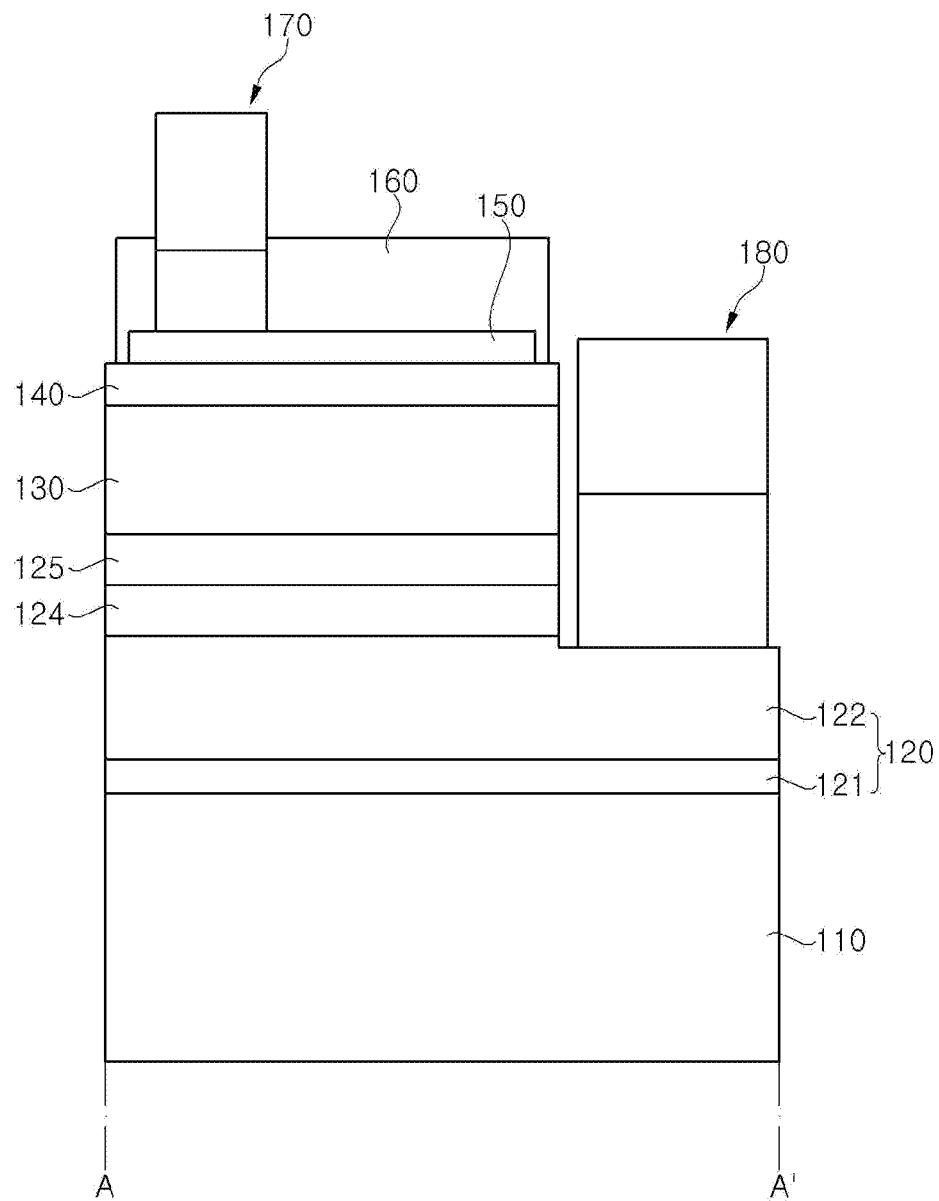
FIG. 11 is a cross-sectional view of a UV light detection device according to yet another exemplary embodiment of the present invention.

FIG. 11 is a cross-sectional view of a UV light detection device according to yet another exemplary embodiment of the present invention.

Referring to FIG. 11, the UV light detection device according to this exemplary embodiment is substantially similar to the UV light detection device shown in FIG. 9 excluding an AlN layer 124 formed on the second buffer layer 122. Thus, detailed description of the same components will be omitted and the following description will focus on different features of the UV light detection device according to this exemplary embodiment.

The UV light detection device according to this exemplary embodiment includes a light absorption layer 130 formed on the second buffer layer 122, in which the light absorption layer 130 may include an $Al_xGa_{1-x}N$ (0<x<0.7) layer. The light absorption layer 130 may have an Al content of 30% or more and a thickness of 0.1 μm or more to be used as an absorption layer for detection of UV light in a certain UV range (for example, UVC).

However, upon growth of the light absorption layer 130 under these conditions, cracks can be generated due to a difference in coefficient of thermal expansion and lattice mismatch between the light absorption layer 130 and the second buffer layer 122, thereby causing degradation in characteristics and yield.

Accordingly, the high temperature AlN layer 124 may be formed at the same growth temperature as the light absorption layer 130, for example, at about 1,050° C., between the second buffer layer 122 and the light absorption layer 130 to suppress generation of cracks.

On the other hand, although the AlN layer 124 serves to suppress generation of cracks, the AlN layer 124 has a high energy bandgap of about 6 eV, which is similar to the energy bandgap of an insulation layer, does not provide high quality of crystallinity and can obstruct flow of minute current due to insulating characteristics thereof. Accordingly, the AlN layer 124 may have a thickness of 100 nm or less.

In this viewpoint, the low current blocking layer 125 according to this exemplary embodiment is formed between the AlN layer 124 and the light absorption layer 130 and can be grown at a low temperature than the light absorption layer 130 to have the same Al content as the light absorption layer 130. Here, the total thickness of the low current blocking layer 125 may range from 0.06 μm to 0.10 μm in order to minimize reduction in current flow due to light energy absorbed by the light absorption layer 130.

Figure 12A:
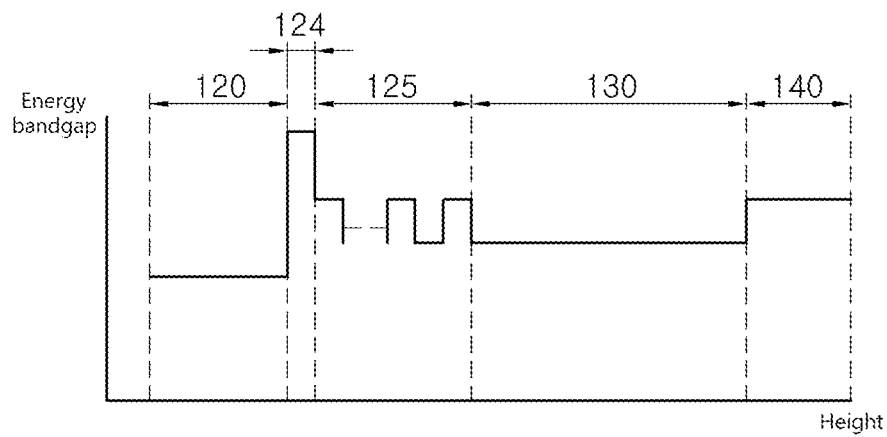
FIGS. 12A and 12B show an energy band diagrams of a UV light detection device according to yet another exemplary embodiment of the present invention.
Figure 12B:
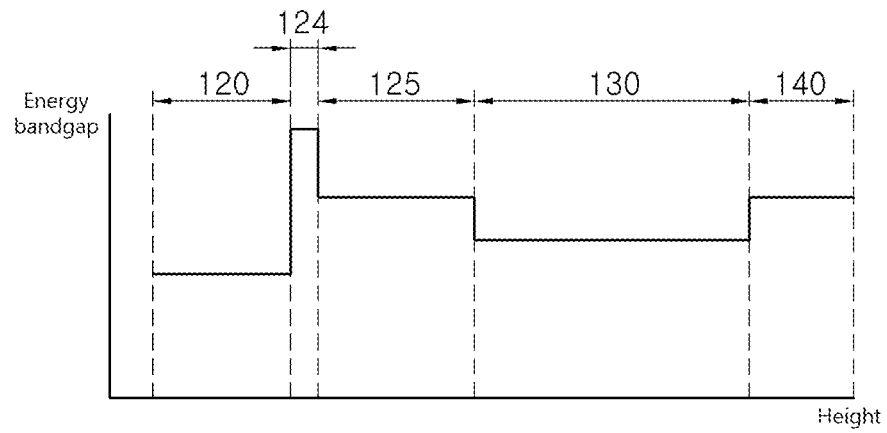

FIGS. 12A and 12B show energy band diagrams of a UV light detection device according to yet another exemplary embodiment of the present invention. Specifically, FIG. 12 shows the energy band diagrams of the UV light detection device shown in FIG. 11.

Specifically, FIG. 12A and FIG. 12B show the energy band diagrams of the UV light detection device having the structure wherein the AlN layer 124 is interposed between the contact layer 120 and the low current blocking layer 125 in order to suppress crack generation during growth of the light absorption layer 130 on the contact layer 120 when the light absorption layer 130 including an $Al_xGa_{1-x}N$ (0<x<0.7) layer has an Al content of 30% or more. Referring to FIG. 12A and FIG. 12B, the light absorption layer 130 has a higher energy bandgap than the contact layer 120, the capping layer 140 has a higher energy bandgap than the light absorption layer 130, and the AlN layer 124 has a higher energy bandgap than the low current blocking layer or the capping layer.

Referring to FIG. 12A, the low current blocking layer 125 is composed of $Al_tGa_{1-t}N$ (0<t<1) layers having different Al contents, and if the Al content of the low current blocking layer 125 is higher than that of the light absorption layer 130 or the Al content of the low current blocking layer 125 is lower than that of the light absorption layer 130, the cut-off inclination can be changed.

Figure 13:
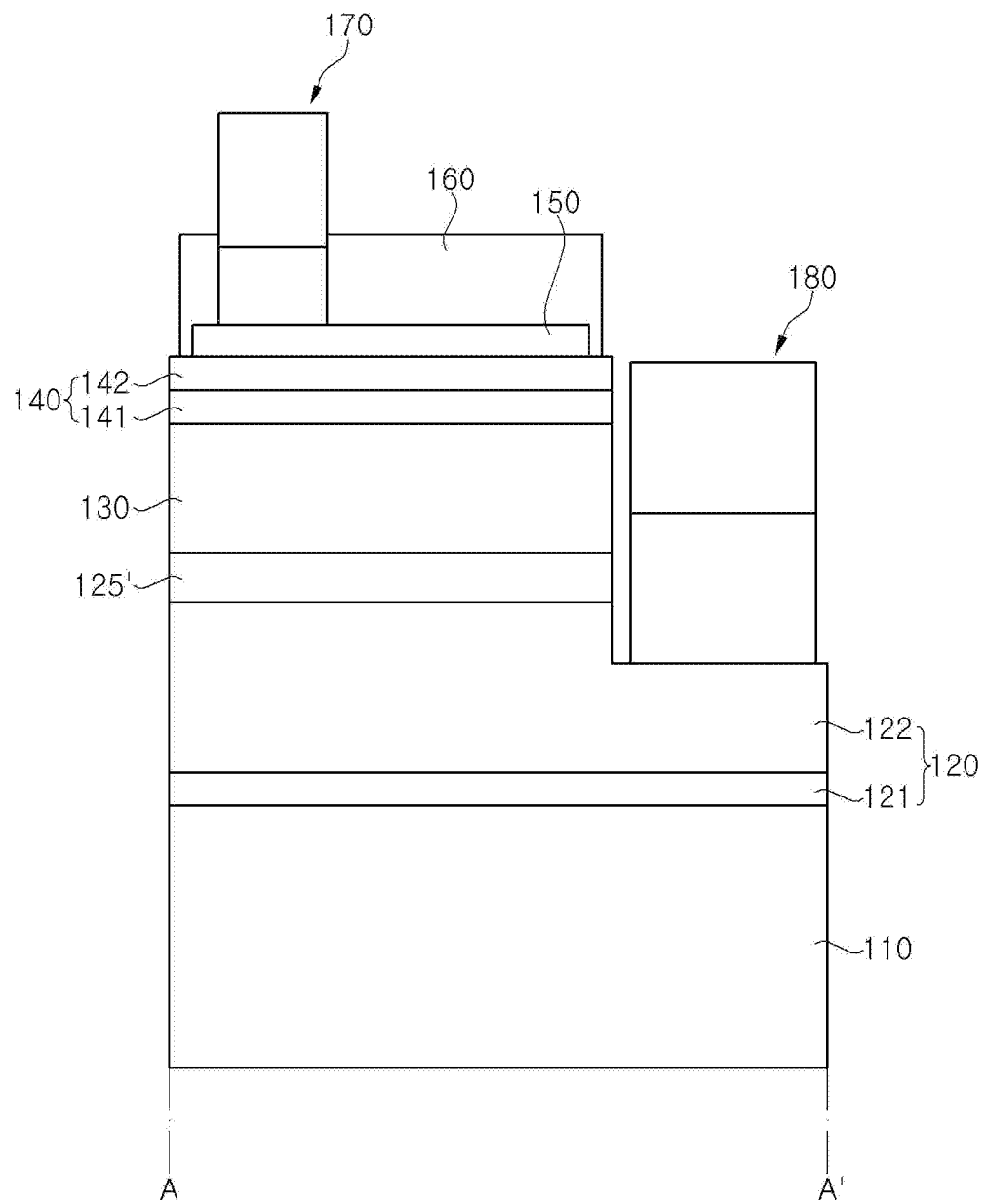
FIG. 13 is a cross-sectional view of a UV light detection device according to yet another exemplary embodiment of the present invention.

FIG. 13 is a cross-sectional view of a UV light detection device according to yet another exemplary embodiment of the present invention. The cross-sectional view of FIG. 13 is taken along line A-A' of FIG. 1 and the UV light detection device according to this exemplary embodiment is different from the UV light detection device shown in FIG. 7 in that the capping layer 140 includes a first layer 141 and a second layer 142. Thus, detailed description of the same components will be omitted and the following description will focus on different features of the UV light detection device according to this exemplary embodiment.

According to this exemplary embodiment, the light absorption layer 130 includes an $In_yGa_{1-y}N$ (0<y<1) layer. The capping layer 140 may include the first layer 141 and the second layer 142. The first layer 141 is grown on the light absorption layer 130 including the $In_yGa_{1-y}N$ (0<y<1) layer. The first layer 141 may be a GaN layer grown at the same growth temperature as the light absorption layer 130, for example, at 700° C. to 900° C., after growth of the light absorption layer 130 in order to prevent decomposition of indium during growth of the light absorption layer 130 containing indium (In), which is likely to decompose at high temperature. The second layer 142 may be an $Al_{k3}Ga_{1-k3}N$ (0<k3<1) layer grown on the first layer 141 by supplying an Al source to the first layer 141. The second layer 142 is grown at a higher temperature, for example, at 900° C. to 1,000° C., than the light absorption layer 130 and includes Al, thereby securing Schottky characteristics of the Schottky layer 150. Alternatively, the capping layer 140 may be formed by stacking the first layer and the second layer having different compositions.

Each of the first layer 141 and the second layer 142 may have a thickness of, for example, 1 nm to 10 nm, at which the tunneling effect can occur. If the first layer 141 and the second layer 142 have too large thicknesses, the capping layer can act as a light absorption layer. Thus, proper thickness maintenance is required.

Figure 14:
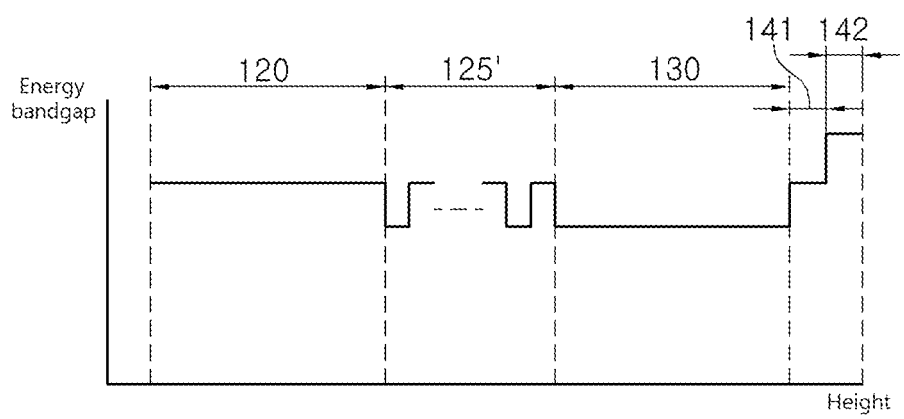
FIG. 14 shows an energy band diagram of a UV light detection device according to yet another exemplary embodiment of the present invention.

FIG. 14 shows an energy band diagram of a UV light detection device according to yet another exemplary embodiment of the present invention.

Referring to FIG. 14, in the UV light detection device according to this exemplary embodiment, the intermediate buffer layer 125' having a multilayer structure and a lower energy bandgap than the contact layer 120 is grown on the contact layer 120, the light absorption layer 130 having the same or lower energy bandgap than the intermediate buffer layer 125' is grown on the intermediate buffer layer 125', the first layer 141 of the capping layer having a higher energy bandgap than the light absorption layer 130 is grown on the light absorption layer 130, and the second layer 142 of the capping layer having a higher energy bandgap than the first layer 141 is grown on the first layer 141.

It should be understood that the above description is provided for illustration only and various modifications, variations, and alterations can be made by those skilled in the art without departing from the spirit and scope of the present invention.

That is, it should be understood that above exemplary embodiments are provided for illustration only and are not to be construed in any way as limiting the present invention. For example, each component illustrated as an integrated structure may be realized by dispersed components, and components illustrated as being separated from each other may also be realized by a coupled structure.

Therefore, the scope of the present invention should be interpreted according to the appended claims as covering all modifications and variations derived from the appended claims and equivalents thereof.

The invention claimed is:

1. A UV light detection device comprising:
   a substrate;
   a buffer layer disposed on the substrate;
   a light absorption layer disposed on the buffer layer;
   a capping layer disposed on the light absorption layer; and
   a Schottky layer disposed in a partial region of the capping layer,
   wherein the capping layer has a higher energy bandgap than the light absorption layer.

2. The UV light detection device according to claim 1, wherein the light absorption layer comprises an AlxGa1-xN (0<x<0.7) layer and the capping layer comprises an AlGaN layer having a higher Al content than the light absorption layer.

3. The UV light detection device according to claim 2, further comprising:
   a low current blocking layer interposed between the buffer layer and the light absorption layer,
   wherein the low current blocking layer comprises a single AlGaN layer or a plurality of AlGaN layers having different Al contents.

4. The UV light detection device according to claim 3, further comprising:
an anti-ESD layer interposed between the buffer layer and the low current blocking layer,
wherein the anti-ESD layer comprises a Si non-doped GaN layer.

5. The UV light detection device according to claim 3, further comprising:
an AlN layer interposed between the buffer layer and the low current blocking layer when the light absorption layer has an Al content of 30% or more.

6. The UV light detection device according to claim 1, wherein the light absorption layer comprises a GaN layer and the capping layer comprises an AlGaN layer.

7. The UV light detection device according to claim 6, further comprising:
a low current blocking layer interposed between the buffer layer and the light absorption layer,
wherein the low current blocking layer comprises a single AlGaN layer or a plurality of AlGaN layers having different Al contents.

8. The UV light detection device according to claim 1, wherein the light absorption layer comprises an $In_yGa_{1-y}N$ ($0<y<1$) layer.

9. The UV light detection device according to claim 8, wherein the capping layer comprises a GaN layer or an AlGaN layer.

10. The UV light detection device according to claim 8, wherein the capping layer comprises a first layer covering the light absorption layer and a second layer disposed on the first layer, the first layer comprising a GaN layer, the second layer comprising an AlGaN layer.

11. The UV light detection device according to claim 10, wherein each of the first layer and the second layer has a thickness of 1 nm to 10 nm.

12. The UV light detection device according to claim 8, further comprising:
an intermediate buffer layer interposed between the buffer layer and the light absorption layer,
wherein the intermediate buffer layer comprises a plurality of InGaN layers and GaN layers.

13. The UV light detection device according to claim 1, wherein the light absorption layer is formed to a thickness of 0.05 μm to 0.5 μm.

14. The UV light detection device according to claim 1, wherein the substrate is one of a sapphire substrate, a SiC substrate, a GaN substrate, an AlN substrate, and a Si substrate.

15. The UV light detection device according to claim 1, wherein the buffer layer comprises a first buffer layer disposed on the substrate and a second buffer layer disposed on the first buffer layer,
each of the first and second buffer layers comprising a GaN layer.

16. The UV light detection device according to claim 1, wherein the Schottky layer is formed of at least one of ITO, Ni, ATO, Pt, W, Ti, Pd, Ru, Cr, and Au.

17. The UV light detection device according to claim 1, further comprising:
an insulation layer disposed on the capping layer,
wherein the insulation layer covers upper and side surfaces of the Schottky layer.

18. The UV light detection device according to claim 17, wherein the insulation layer comprises one of a $SiN_x$ layer and a $SiO_x$ layer.

19. The UV light detection device according to claim 1, further comprising:
a first electrode layer disposed on the Schottky layer.

20. The UV light detection device according to claim 19, further comprising:
a second electrode layer disposed on the buffer layer,
the second electrode layer forming ohmic contact with the buffer layer.

* * * * *